PROTECTED WIDE-SWING MULTISTAGE AMPLIFIER, PARTICULARLY
FOR BIO-MEDICAL USE
Filed June 6, 1968
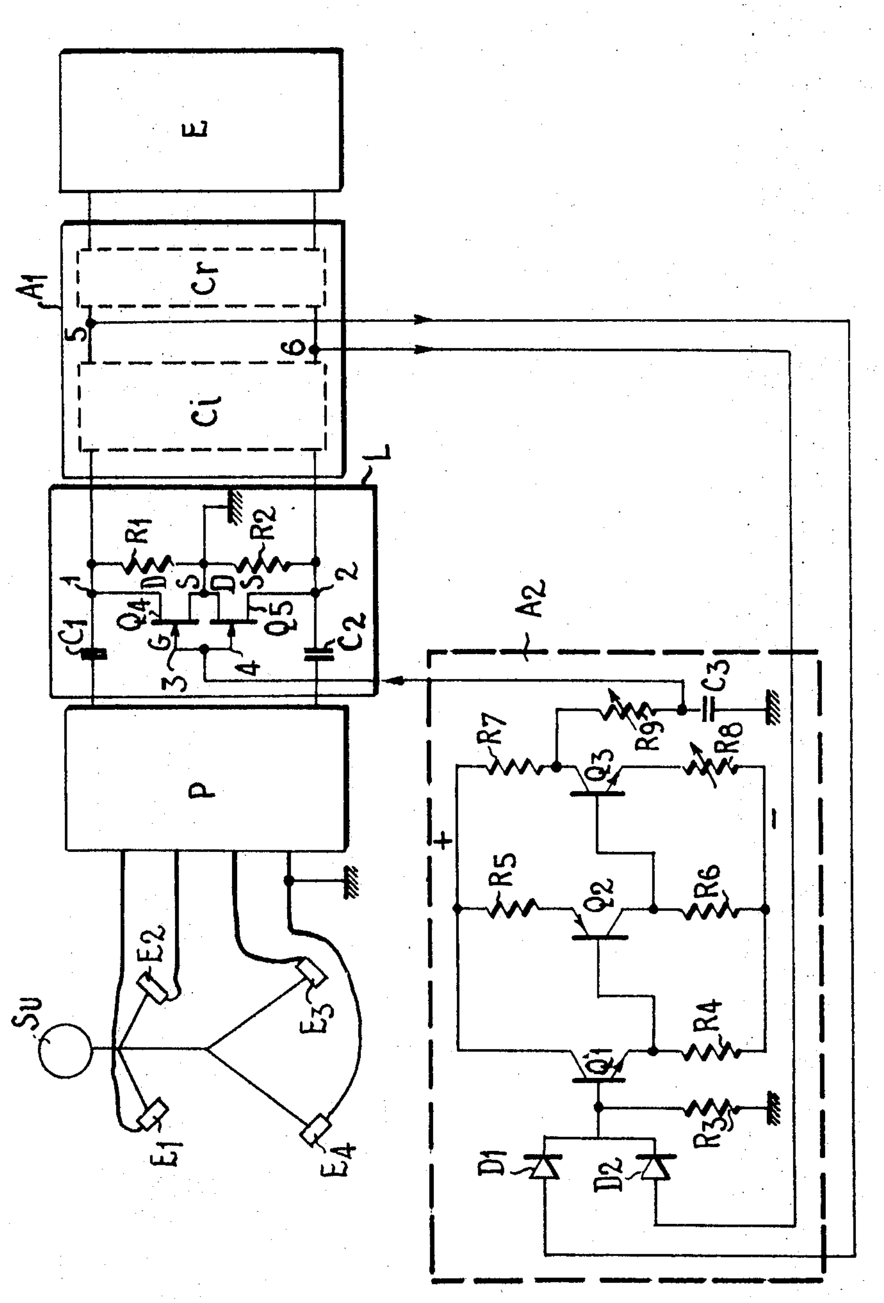
ROMUALD JEAN PLASZCZYNSKI &
CLAUDE VACLAW BABICKA,
Inventors
by [illegible]

3,533,003

PROTECTED WIDE-SWING MULTISTAGE AMPLIFIER, PARTICULARLY FOR BIO-MEDICAL USE

Romuald Jean Plaszczynski, Velisy-Villacoublay, and Claude Vaclaw Babicka, Courbevoie, France, assignors to Thomson-Medical-Telco, Paris, France, a corporation of France Filed June 6, 1968, Ser. No. 735,154
Claims priority, application France, June 8, 1967, 109,554
Int. Cl. H03f 3/16, 21/00
U.S. Cl. 330—11 5 Claims

ABSTRACT OF THE DISCLOSURE

An R-C coupling network interconnects stages of an amplifier subject to wide input potential swings; to provide for short time constants of the coupling networks upon application of excessive voltage, field effect transistors are connected in parallel to the resistance elements of the R-C coupling networks, the field effect transistors being normally non-conductive, but controlled to conduction by a threshold sensing amplifier, so that the normal resistance of the R-C network, essentially unaffected by the high non-conduction impedance of the field effect transistors, is shunted by the low conduction resistance of the field effect transistors, and the time constant of the coupling network is reduced to a low value. An integrating circuit in the threshold detector determines the time constant of recovery of the field effect transistor, and thus the time of blocking of the timing function of the R-C coupling network.

The present invention relates to wide-swing multistage amplifiers, particularly for biological and medical use, and is especially directed to coupling networks between a pre-amplifier and an amplification stage in a series of amplification stages.

Amplifiers used in medical and biological applications usually are multistage amplifiers interconnected by R-C networks. Upon overload, a certain period of blocking, in the order of several seconds, occurs in the interstage coupling of such amplifiers. This blocking time thus constitutes a delay and requires a comparatively long wait between the moment when a patient may be connected to the circuit, and the moment at which biological phenomena, amplified in the amplifier may be observed. Electrocardiograms, or electro-encephalograms, amplified in the amplifiers, thus cannot be observed immediately either on oscilloscopes or on recorders. Each disturbance at the input to the amplifiers, such as a change of placing of the electrodes on the patient, defibrillation shocks, and the like, if they are not to destroy the input stage to the amplifier, cause blocking of the amplifier stage which may last for several tens of seconds. In order to decrease this blocking time, mechanical shorting switches, using push buttons and the like, as well as electro-mechanical devices such as relays have been used, in order to short-circuit all time constant networks between the amplification stages.

It is an object of the present invention to provide an amplifier subject to substantial overload and having R-C coupling networks, in which the time constant of the coupling network can be changed automatically to a low value, upon overload, without destruction of the amplifier.

SUBJECT MATTER OF THE PRESENT INVENTION

Briefly, in accordance with the present invention, an R-C coupling circuit is connected, as well known, between a pre-amplifier stage and an amplifier stage of a biological network, and the resistance element of the coupling network has a field effect transistor connected in parallel thereto. The field effect transistor is normally non-conductive, and thus has a very high value, so that its resistance, in effect, can be neglected with respect to the resistance of the R-C network. A threshold detector device, whose input is coupled to at least one output of the amplifier stage, and whose output is connected to the control electrode of the field effect transistor, which, upon sensing an overload, causes the field effect transistor to become conductive. The resistance of the field effect transistor thus drops to a very low value and the otherwise long blocking time of the amplifier is substantially decreased.

The structure, organization, and operation of the invention will now be described more specifically with reference to the accompanying drawings, wherein the single figure illustrates, partly in schematic block diagram form, partly in schematic circuit diagram form, an amplifier with the coupling network in accordance with the present invention.

Electro-biological phenomena must ordinarily be amplified. Let it be assumed that electro-cardiograph electrodes $E_1$, $E_2$, $E_3$ and $E_4$, applied to a patient *Su* are connected to the input of an electro-cardiograph pre-amplifier P. The initial pre-amplification stage usually has a low voltage gain, for example of gain of 7. This stage is usually supplied with protection against high tension, and further with a switching network so that outputs from the various electrodes can be separately measured. One of the functions of the input pre-amplifier is to assure a very high input impedance, in excess of one Meg-ohm, and further to clearly differentiate from unwanted or parasitical signals, for example in excess of 10,000 Hz., and of a dynamic input potential in excess of 400 mv. Rejection of signals in excess of 400 mv., as previously noted, also forms protection against the high tensions which may occur at the input, for example when defibrillation shocks occur, which may be in excess of 2000 volts, and may be sensed or transferred to the electrodes $E_1$, $E_2$, etc.

After pre-amplification, a coupling network L, which will be described in detail below, connects the output from the pre-amplifier P to a standard amplifier $A_1$, utilizing, preferably, an integrated circuit $c_i$, having a voltage gain of about 700, and further connected to a regulating circuit $C_r$, in which the output signals can be adjusted with respect to the base line of a recorder E, or an oscilloscope, and in which the gain can be controlled without displacement of the output signal from a base line or time scale.

In addition to the pre-amplifier and amplifier, and recorder (or indicator-oscilloscope), an additional control amplifier and threshold detector $A_2$ is provided, whose function will be explained hereinafter.

The coupling circuit L between the pre-amplifier P and the amplifier $A_1$ separates the stages of the amplification chain between the input electrodes $E_1$, $E_2$, etc. and the recorder E. The input signals derived from biomedical phenomena may be masked by direct current potentials, derived from the polarization of the electrodes applied to the patient *Su*, and may reach several hundreds of millivolts. The electro-biological signals themselves, which are to be detected, are in the order of 1 mv. for electro-cardiograms and may be several tens of $\mu$v. for electro-encephalograms. The time constant of the R-C networks in the amplifiers, and primarily in the coupling network L, of the signals to be studied should be in the order of 2 seconds for electro-cardiograms and 0.7 second for electro-encephalograms in order to properly transmit the electro-biological signals.

When the level of the signal at the input exceeds a certain threshold, for example when the electrodes are first applied to the patient, or when the electrodes are changed, or a reading is internally switched, in case of defibrillation shocks or by electrical stimulation of the heart by a pacemaker, the coupling networks may become blocked. In accordance with the present invention, the coupling circuit L is so arranged that the time constant of the R-C circuit is automatically and immediately changed when the input signal exceeds a given threshold value, so that the equilibrium and amplification actions of the amplifiers will be rapidly restored as soon as the disturbing input signals are removed, and without introducing an extensive blocking period of the amplifiers.

The coupling circuit L includes a pair of capacitors $C_1$, $C_2$, of a relatively low capacitance, for example Mylar condensers of about 0.22 $\mu$f. in series with balanced push-pull output lines; high resistances $R_1$, $R_2$, for example of about 10 m$\Omega$, each, are connected across the lines and to chassis (ground) at their center. This kind of a coupling circuit avoids the use of electrolytic condensers of substantial size. Connected in parallel to the resistances $R_1$, $R_2$ are a pair of field effect transistors $Q_4$, $Q_5$. These field effect transistors have their active channel located between drain and source connected from lines 1, 2, to ground, and are thus effectively in shunt with resistances $R_1$, $R_2$.

The coupling network between pre-amplifier P and amplifier $A_1$, with capacitances and resistances of the values above referred to, will have a time constant of about 2 seconds. When the field effect transistors $Q_4$, $Q_5$ are biased beyond pinch-off, i.e., for N-channel FETs, the gates are biased to a negative voltage below pinch-off ($V_p$), their drain-source impedance, that is along the channel of the field effect transistor, will be in excess of 1000 m$\Omega$. This high value has practically no effect on the time constant of the coupling network, which is essentially determined by the value of the resistances $R_1$, $R_2$ and the capacitors $C_1$, $C_2$.

However, when the amplifier, because of any one of the aforementioned reasons, becomes overloaded i.e. the coupling capacitors $C_1$ and/or $C_2$ become charged to a potential, which blocks amplifier $A_1$ for a certain time interval, a high amplitude spurious signal of predetermined polarity appears at at least one of the outputs 5 or 6 of the integrated amplifier $C_1$, which is then applied to threshold detector and control amplifier $A_2$. The output of the control amplifier $A_2$ feeds a control signal to the gates 3 and 4 of field effect transistors $Q_4$ and $Q_5$, which makes them conductive. The drain to source impedance of the field effect transistors will then drop to a value in the order of 100$\Omega$, thus in effect shunting resistances $R_1$, $R_2$ with practically a short circuit and permitting rapid discharge of capacitances $C_1$, $C_2$. This change in the resistance value of the R-C coupling network in the order of $10^{-5}$, changes the time constant of the coupling network from about 2 seconds to about 20 microseconds. This very short time constant of the network now, in effect, formed by capacitances $C_1$, $C_2$ and the conductive field effect transistors $Q_4$, $Q_5$ will persist during the period of time when the field effect transistors are controlled to be conductive.

Control of the field effect transistors $Q_4$, $Q_5$ is obtained from amplifier $A_2$. Input lines to amplifier $A_2$ are connected to terminals 5, 6, forming intermediate terminals, or the outputs, if desired, of amplifier $A_1$. When the potential at points 5, 6 becomes unbalanced (or exceeds a predetermined value with respect to chassis in a single ended amplifier) an output signal will be obtained from amplifier $A_2$. Connections 5, 6 are applied over diodes $D_1$, $D_2$ forming, in combination with resistance $R_3$ an OR-gate the output of which is applied to an amplifier consisting of transistors $Q_1$, $Q_2$, $Q_3$, with associated biasing and connection resistances $R_4$, $R_5$, $R_6$, $R_7$, as well known in the art and the exact circuit of which will be obvious from the drawing and need not be described in detail. The gain of this amplifier, the gate bias voltages of FETs $Q_4$ and $Q_5$ and consequently the threshold above which an output is applied from amplifier $A_2$ which will be sufficient to cause the field effect transistors $Q_4$, $Q_5$ to become conductive is determined by the setting of variable resistance $R_3$. If the potential of either point 5 and/or point 6 becomes too great, or an excessive unbalance exists, corresponding to a disturbance of either positive or negative polarity at the input to the amplifier chain formed by preamplifier P and amplifier $A_1$, field effect transistors $Q_4$, $Q_5$ will be controlled to conduct, and drop to a low resistance value. Input transistor $Q_1$ and resistance $R_4$ are provided for impedance matching and to isolate the output of amplifier $A_1$ from the coupling network L.

Under ordinary, quiesent conditions, the bias of gates 3 and four of the field effect transistors may have a value of −7 v.; upon change of this value to, for example, zero volts, the field effect transistors will become conductive so that the source-drain impedance drops to the low value of about 1000.

A sudden, brief overload appearing at terminals 5 and/or 6 thus will cause an immediate and practically simultaneously drop of the resistance value of the R-C circuit in the coupling network L, so that the capacitors $C_1$, $C_2$ can discharge rapidly. In order to retain the field effect transistors $Q_4$, $Q_5$ in conductive condition for a period of time sufficient for complete discharge of the condensers $C_1$ ,$C_2$, an integrating network consisting of variable resistor $R_9$ and capacitor $C_3$ is inserted at the output of amplifier $A_2$. The resistance $R_9$ is adjustable, so that the time constant of the R-C integrating network in amplifier $A_2$ may be adjusted for example between 10 and 1000 milliseconds. If within a time interval of substantially the same duration the disturbance at the input to the preamplifier P has disappeared, the control signal, fed by the integrating circuit of amplifier $A_2$ to gates 3 and 4 of the field effect transistors $Q_4$ and $Q_5$ respectively, will decrease expotentially towards the initial gate bias voltage and after it has reached the pinch-off value, the field effect transistors will be turned off and the amplifier chain reverts to normal amplification with the normal time constants of the coupling networks as determined by the design for transmission of electro-biological signals. If the disturbance, however, has not yet ceased, the coupling circuit will remain shorted until the disturbance condition—and the additional time due to the integrating network $R_9$, $C_3$, has disappeared.

The result of incorporating the field effect transistors $Q_4$, $Q_5$, controlled by amplifier $A_2$ into the coupling circuit L, thus permits a reduction of blocking time interval of the amplifier chain, due to excess voltage disturbances, from many seconds, with apparatus of the prior art, to fractions of a second. This is particularly important when a patient's reaction, as measured by electro-biological phenomena, to electrical stimuli is to be observed.

In electro-encephalography a very high amplification, in the order of 100,000 and up, is necessary, and the amplifier chain between pre-amplifier P and recorder or indicator E may include a number of amplifiers, each connected by coupling networks similar to network L, and each having field effect transistors, which all can be controlled from a single control amplifier $A_2$.

Amplifiers having coupling networks in accordance with the present invention may, of course, also find use in many other applications where rapid recovery of normal amplifier performance and characteristics, after overload, is important.

What is claimed is:

1. A multistage amplifier with overload protection, particularly for electro-biological applications, comprising:

a first amplifying stage having at least one input and at least one output;

a second amplifying stage having at least one input and at least one output;

resistor-capacitor interstage coupling circuits inserted between each of said first stage outputs and said second stage inputs, said capacitor being connected in series between said first stage output and said second stage input and said resistor being connected between said second stage input and ground; field effect transistors with their channels connected in parallel to each of said resistors, having gates; and means for controlling said field effect transistors having at least one input connected to at least one of said second stage outputs and an output connected to siad field effect transistor gates, said controlling means comprising: means for generating a control signal for setting on said field effect transistors, having an input connected to said controlling means input and including threshold sensitive means for determining the level of overload signals of both polarities for which said field effect transistors are set on, whereby fast recovery from overload is ensured; means for generating a bias voltage for said field effect transistor gates beyond the pinch-off value, and means for applying said control signal and said gate bias voltage to said controlling means output.

2. Amplifier according to claims 1, wherein said control signal generating means include a D.C. amplifier comprising an input stage supplying a signal of one, predetermined polarity for overload voltages of both polarities, and an output stage.

3. Amplifier according to claim 2, wherein said means for generating a gate bias voltage are adjustable and combined with said D.C. amplifier output stage, and constitute, together with said field effect transistor, said threshold means.

4. Amplifier according to claim 1, wherein said control signal and gate bias applying means include a resistor-capacitor integrating network having an input coupled to both said control signal and said gate bias voltage generating means and having an output connected to said controlling means output, said integrating network having a time constant which is lower than that of said coupling circuit.

5. Amplifier according to claim 3, wherein at least one element of said resistor-capacitor integrating network is adjustable.

References Cited

UNITED STATES PATENTS

| | | | |
|---|---|---|---|
| 3,254,308 | 5/1966 | McLean et al. ------ | 330—29 X |
| 3,451,006 | 6/1969 | Grangaard ------- | 330—29 X |

NATHAN KAUFMAN, Primary Examiner

U.S. Cl. X.R.

307—202; 330—3, 15, 24, 29, 38, 138